United States Patent
Bang et al.

(10) Patent No.: US 9,917,294 B2
(45) Date of Patent: *Mar. 13, 2018

(54) BATTERY CELL ASSEMBLY OF NOVEL STRUCTURE AND BATTERY PACK EMPLOYED WITH THE SAME

(75) Inventors: Seunghyun Bang, Chungcheongbuk-do (KR); SooRyoung Kim, Daejeon (KR); Youngsun Park, Chungcheongbuk-do (KR); Chunyeon Kim, Chungcheongbuk-do (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/576,361

(22) PCT Filed: Jan. 26, 2011

(86) PCT No.: PCT/KR2011/000538
§ 371 (c)(1),
(2), (4) Date: Sep. 13, 2012

(87) PCT Pub. No.: WO2011/093639
PCT Pub. Date: Aug. 4, 2011

(65) Prior Publication Data
US 2013/0004799 A1    Jan. 3, 2013

(30) Foreign Application Priority Data
Feb. 1, 2010  (KR) .................. 10-2010-0009178

(51) Int. Cl.
*H01M 10/42*  (2006.01)
*H01M 2/34*   (2006.01)
(Continued)

(52) U.S. Cl.
CPC ........... *H01M 2/34* (2013.01); *H01M 2/1061* (2013.01); *H01M 2/204* (2013.01); *B23K 11/20* (2013.01);
(Continued)

(58) Field of Classification Search
CPC .......... H05K 1/14; H01M 14/00; H01M 2/10; H01M 10/50; H01M 2/02; H01M 2/34;
(Continued)

(56) References Cited

U.S. PATENT DOCUMENTS 9,520,620 B2 * 12/2016 Bang ................... H01M 2/20
2002/0061436 A1 * 5/2002 Inagaki ............ H01M 2/0212
429/120
(Continued)

FOREIGN PATENT DOCUMENTS

BA    2003019569 A  *  1/2003 ............. B23K 11/20
CN    101478034 A      7/2009
(Continued)

OTHER PUBLICATIONS

English translation of JP2003019569.*
(Continued)

*Primary Examiner* — Milton I Cano
*Assistant Examiner* — Kiran Q Akhtar
(74) *Attorney, Agent, or Firm* — Birch, Stewart, Kolasch & Birch, LLP

(57) ABSTRACT

Disclosed herein is a battery cell assembly including a battery cell array including two or more battery cells, each of which has an electrode assembly of a cathode/separator/anode structure disposed in a battery case together with an electrolyte in a sealed state, arranged in the lateral direction, and a protection circuit module (PCM) connected to the upper end of the battery cell array to control the operation of the battery pack, wherein the outer sides of the battery cells (Continued)

or the outer side of the battery cell array is coated with a resin by insert injection molding excluding electrode terminals of the battery cells.

18 Claims, 14 Drawing Sheets

(51) Int. Cl.
```
H01M 2/20      (2006.01)
H01M 2/10      (2006.01)
B23K 11/20     (2006.01)
H01M 2/00      (2006.01)
H05K 1/14      (2006.01)
H01M 2/12      (2006.01)
H01M 10/052    (2010.01)
H01M 2/02      (2006.01)
```

(52) U.S. Cl.
CPC ............ *H01M 2/00* (2013.01); *H01M 2/0267* (2013.01); *H01M 2/10* (2013.01); *H01M 2/12* (2013.01); *H01M 10/052* (2013.01); *H01M 10/42* (2013.01); *H01M 2200/00* (2013.01); *H05K 1/14* (2013.01); *Y10T 29/4911* (2015.01); *Y10T 29/49204* (2015.01)

(58) Field of Classification Search
CPC ...... H01M 2/204; H01M 2/1061; H01M 2/12; H01M 2/00; H01M 2/0267; H01M 10/052; H01M 10/42; H01M 2200/00; B23K 11/20; Y10T 19/4911; Y10T 19/49204
USPC ............... 429/7; 29/874, 623.2; 264/272.14; 361/736
See application file for complete search history.

(56) References Cited

U.S. PATENT DOCUMENTS

| | | | |
|---|---|---|---|
| 2003/0146734 A1 | 8/2003 | Kozu et al. | |
| 2006/0099503 A1 | 5/2006 | Lee | |
| 2006/0266542 A1* | 11/2006 | Yoon | H01M 2/1061 174/112 |
| 2008/0166628 A1* | 7/2008 | Kim | H01M 2/0207 429/163 |
| 2009/0176156 A1* | 7/2009 | Lee | H01M 2/021 429/178 |
| 2009/0186270 A1 | 7/2009 | Harada et al. | |
| 2010/0047676 A1* | 2/2010 | Park | H01M 2/105 429/93 |

FOREIGN PATENT DOCUMENTS

| | | | | |
|---|---|---|---|---|
| EP | 1981101 A1 | | 10/2008 | |
| JP | 2000-182581 A | | 6/2000 | |
| JP | 2001-266820 | * | 9/2001 | ............. H01M 2/10 |
| JP | 2001-266820 A | | 9/2001 | |
| JP | 2002-216722 A | | 8/2002 | |
| JP | 2003-019569 A | | 1/2003 | |
| JP | 2003019569 A | * | 1/2003 | ............. B23K 11/20 |
| JP | 2005-123127 | * | 5/2005 | ............. H01M 2/02 |
| JP | 2005-123127 A | | 5/2005 | |
| JP | 2006-139972 A | | 6/2006 | |
| JP | 2008-270350 A | | 11/2008 | |
| JP | 2009-76351 A | | 4/2009 | |
| KR | 1020040062914 | * | 6/2004 | ............. H01M 2/10 |
| KR | 10-2004-0046272 | * | 3/2006 | ............. H01M 2/10 |
| KR | WO 2008018714 A1 | * | 2/2008 | ............. H01M 2/105 |
| KR | 10-2009-0042683 A | | 4/2009 | |
| WO | WO 2008018714 A1 | * | 2/2008 | .......... H01M 21/105 |

OTHER PUBLICATIONS

English Translation of KR 1020040062914.*
English translation of JP 2003019569 A.*
English translation of JP2005-123127.*
English translation of JP2003019569 A.*
English translation of KR10-2004-0046272.*
English translation of KR1020040062914.*
English translation of JP2001-266820.*
PCT/ISA/210—International Search Report mailed Sep. 19, 2011, issued in PCT/KR2011/000538.

* cited by examiner

BATTERY CELL ASSEMBLY OF NOVEL STRUCTURE AND BATTERY PACK EMPLOYED WITH THE SAME

TECHNICAL FIELD

The present invention relates to a battery cell assembly of a novel structure, and, more particularly, to a battery cell assembly including a battery cell array including two or more battery cells, each of which has an electrode assembly of a cathode/separator/anode structure disposed in a battery case together with an electrolyte in a sealed state, arranged in the lateral direction, and a protection circuit module (PCM) connected to the upper end of the battery cell array to control the operation of the battery pack, wherein the outer sides of the battery cells or the outer side of the battery cell array is coated with a resin by insert injection molding excluding electrode terminals of the battery cells.

BACKGROUND ART

Various kinds of combustible materials are contained in a secondary battery. As a result, the secondary battery may be heated or explode due to overcharge of the secondary battery, overcurrent in the secondary battery, or other physical external impact applied to the secondary battery. That is, the safety of the secondary battery is very low. Consequently, safety elements, such as a positive temperature coefficient (PTC) element and a protection circuit module (PCM), to effectively control an abnormal state of the secondary battery, such as overcharge of the secondary battery or overcurrent in the secondary battery, are disposed on a battery cell in a state in which the safety elements are connected to the battery cell.

Meanwhile, a conventional battery pack for laptop computers is manufactured by electrically connecting several secondary batteries exhibiting high flexibility in series or in parallel to each other and connecting the secondary batteries to a protection circuit by welding to manufacture a battery cell assembly, which is called a soft pack, and enclosing the battery cell assembly in a plastic pack case so as to protect the battery cell assembly from external impact or provide an aesthetically pleasing appearance.

In the method of manufacturing the conventional battery pack for laptop computers as described above, however, it is difficult to assemble the battery pack due to high flexibility of the secondary batteries.

Also, a bonding agent or a double-sided adhesive tape is provided between the pack case and the secondary batteries so as to prevent the secondary batteries from moving in the pack case after the battery pack is assembled. As a result, the number of parts constituting the battery pack is increased, and the battery pack manufacturing process is complicated. In addition, the secondary batteries move in the pack case when external impact is applied to the battery pack with the result that the battery pack may malfunction.

Therefore, there is a high necessity for a battery cell assembly having a specific structure that is capable of solving assembly complexity, which is caused when the battery pack for laptop computers with the above-stated construction is manufactured, and preventing movement of battery cells, such as secondary batteries, in a pack case, which is also caused when the battery pack for laptop computers with the above-stated construction is manufactured.

Meanwhile, a battery pack mounted in a laptop computer requires high power and capacity. To this end, a conventional cylindrical battery pack including a plurality of cylindrical battery cells has generally been used. In recent years, however, the size of a laptop computer has been reduced, and therefore, there is a high necessity for a slim type battery pack.

Therefore, there is a high necessity for a technology that is capable of using high capacity pouch-shaped battery cells to manufacture a slim type battery pack, thereby increasing overall current capacity of the battery pack.

DISCLOSURE

Technical Problem

Therefore, the present invention has been made to solve the above problems and other technical problems that have yet to be resolved.

Specifically, it is an object of the present invention to provide a battery cell assembly wherein battery cells or a battery cell array is coated with a resin by insert injection molding excluding electrode terminals of the battery cells, thereby simplifying an assembly process and effectively preventing the battery cells or the battery cell array from moving in a pack case.

It is another object of the present invention to provide a battery cell assembly wherein battery cells or a battery cell array is coated with a resin, whereby the battery cell assembly is prevented from being damaged when external force is applied to the battery cell assembly and exhibits high mechanical strength.

Technical Solution

In accordance with one aspect of the present invention, the above and other objects can be accomplished by the provision of a battery cell assembly including (a) a battery cell array including two or more battery cells, each of which has an electrode assembly of a cathode/separator/anode structure disposed in a battery case together with an electrolyte in a sealed state, arranged in the lateral direction, and (b) a protection circuit module (PCM) connected to the upper end of the battery cell array to control the operation of the battery pack, wherein the outer sides of the battery cells or the outer side of the battery cell array is coated with a resin by insert injection molding excluding electrode terminals of the battery cells.

In the battery cell assembly according to the present invention, the outer sides of the battery cells or the outer side of the battery cell array is coated with the resin by insert injection molding excluding the electrode terminals of the battery cells. Consequently, the battery cell assembly according to the present invention exhibits higher mechanical resistance to external impact than a conventional battery pack structure.

Also, the battery cell assembly according to the present invention can be more easily assembled than the conventional battery pack structure, and it is possible to prevent the battery cells or the battery cell array from moving in the pack case.

The resin is not particularly restricted so long as the battery cells or the battery cell array can be easily coated with the resin. For example, the resin may be rubber or plastic.

The battery cell assembly is configured to have a structure in which the outer side of the battery cell array and the outer side of the protection circuit module are completely coated with rubber or plastic by insert injection molding. Upon manufacturing a battery pack using only the battery cell assembly, therefore, it is possible to easily manufacture the battery pack without using an additional pack case.

The protection circuit module may include connection terminals connected to the electrode terminals of the battery cells by resistance welding, metal plates to electrically connect the battery cells to each other, and a protection circuit to control the operation of the battery pack.

In a preferred example of the above-mentioned structure, the metal plates to electrically connect the battery cells to each other may be formed at the top of the protection circuit module. In this structure, it is possible to easily manufacture the PCM and to easily assemble the battery cell assembly as compared with a conventional battery cell assembly structure in which metal wires are formed at a layer in the protection circuit of the PCM so as to electrically connect battery cells to each other.

In another preferred example of the above-mentioned structure, electrical connection regions between cathode terminals of the battery cells and the protection circuit module may be configured to have a structure in which conductive plates attached to tops of the respective connection terminals of the protection circuit module are welded so that the conductive plates wrap the respective cathode terminals of the battery cells.

In the battery cell assembly with the above-stated construction, therefore, the connection terminals of the protection circuit module and the cathode terminals of the battery cells are directly connected to each other with high welding coupling force via the conductive plates, which are configured to have a specific structure, and the battery cells are electrically connected in series to each other via the metal plates included in the protection circuit module. Consequently, it is possible to easily manufacture a high capacity battery cell assembly through the use of a simple method.

For example, in a case in which a battery cell assembly is constituted by three battery cells, the battery cells are arranged in the lateral direction to constitute a battery cell array, and electrode terminals of the battery cells and connection terminals of the PCM are connected to each other by resistance welding, thereby manufacturing a desired battery cell assembly.

Specifically, the conductive plates may be attached to the connection terminals of the protection circuit module so that the conductive plates can be bent, the conductive plates may be bent in a bracket shape in a state in which the cathode terminals of the battery cells are placed on the conductive plates, and resistance welding may be carried out from above the bent portions of the conductive plates, thereby achieving physical coupling and electrical connection between the connection terminals of the protection circuit module and the cathode terminals of the battery cells.

The shape of the conductive plates is not particularly restricted so long as the conductive plates can be easily bent. For example, the conductive plates may be formed in an L shape in a state in which the conductive plates are attached to the corresponding connection terminals of the protection circuit module.

Each of the conductive plates may include a first connection part attached to the top of a corresponding one of the connection terminals of the protection circuit module and a second connection part attached to the top of the cathode terminal of a corresponding one of the battery cells. Consequently, the connection between the cathode terminals of the battery cells and the connection terminals of the protection circuit module is more securely achieved. In addition, when external force is applied to the battery cell assembly, deformation of the electrical connection regions between the cathode terminals of the battery cells and the protection circuit module is prevented.

The material composing each of the conductive plates is not particularly restricted so long as the conductive plates can provide high coupling force when the conductive plates are welded as described above. Preferably, each of the conductive plates is a nickel plate, and each of the cathode terminals of the battery cells is an aluminum terminal.

Consequently, electric current from a resistance welding rod during resistance welding between the nickel plate and the aluminum terminal flows from the nickel plate, resistance of which is high, to the aluminum terminal, resistance of which is low, with the result that the resistance welding between the nickel plate and the aluminum terminal is easily achieved.

In the battery cell assembly according to the present invention, any battery cells may be used in various manners irrespective of the kind and shape of the battery cells. A pouch-shaped secondary battery of an approximately hexahedral structure having a small thickness to width ratio, preferably a pouch-shaped lithium ion polymer battery, may be used as each battery cell of the battery cell assembly.

According to circumstances, an external input and output terminal, which inputs electric current to the battery cell assembly, outputs electric current from the battery cell assembly, and transmits and receives information, may be mounted at the front of the protection circuit module in a depressed form.

In this structure, the battery cell assembly can be stably connected to an external device through the external input and output terminal since the external input and output terminal is configured to have a connector structure.

In accordance with another aspect of the present invention, there is provided a battery pack including the battery cell assembly with the above-stated construction and a pack case in which the battery cell assembly is disposed.

Preferably, the pack case includes a lower case, at which the battery cell array and the protection circuit module are disposed, and an upper case to cover the lower case so as to fix the battery cell array and the protection circuit module in place.

The lower case may be partitioned into a battery cell mounting part, at which the battery cells are disposed, and a protection circuit module mounting part, at which the protection circuit module is disposed, and a partition wall may be formed at the interface between the battery cell mounting part and the protection circuit module mounting part. Also, openings, through which electrode terminals of the battery cells are exposed toward the protection circuit module, may be formed at portions of the partition wall corresponding to electrical connection regions between the electrode terminals of the battery cells and the protection circuit module.

In this pack case structure, it is possible to restrain contact between the electrode terminals of the battery cells and the parts of the protection circuit module since the partition wall is formed at the interface between the battery cell mounting part and the protection circuit module mounting part. Also, even when an electrolyte leaks from one or more of the battery cells, the electrolyte is prevented from flowing to the protection circuit module, thereby preventing the occurrence of a short circuit.

Also, since the openings, through which the electrode terminals of the battery cells are exposed toward the protection circuit module, are formed at portions of the partition wall corresponding to the electrical connection regions between the electrode terminals of the battery cells and the protection circuit module, it is possible to easily weld the electrode terminals of the battery cells, which are exposed through the openings, to the connection terminals of the protection circuit module.

The height of the partition wall may be sufficient to fully isolate the battery cell mounting part and the protection circuit module mounting part from each other.

The protection circuit module mounting part may be configured to have a structure including support parts to support the electrical connection regions between the electrode terminals of the battery cells and the protection circuit module.

The shape of the support parts is not particularly restricted so long as the support parts can easily support the electrical connection regions between the electrode terminals of the battery cells and the protection circuit module. For example, the support parts may be formed on the lower case in the shape of an upward protrusion.

Preferably, the support parts are formed in the shape of a cross-shaped protrusion. Consequently, it is possible for the support parts to more stably support the electrical connection regions between the electrode terminals of the battery cells and the protection circuit module during resistance welding between the electrode terminals of the battery cells and the protection circuit module.

In accordance with another aspect of the present invention, there is provided a laptop computer including the battery pack with the above-stated construction as a power source.

However, the battery pack according to the present invention may be manufactured so as to provide power and capacity required by a device by varying the number of battery cells constituting the battery pack. Of course, therefore, the battery pack according to the present invention can be applied to various devices requiring variable battery capacities in addition to the laptop computer.

In accordance with a further aspect of the present invention, there is provided a method of manufacturing a battery pack. Specifically, a method of manufacturing a battery pack according to the present invention includes (a) arranging two or more battery cells, each of which has an electrode assembly of a cathode/separator/anode structure disposed in a battery case together with an electrolyte in a sealed state, in the lateral direction to form a battery cell array, (b) coupling connection terminals of a protection circuit module (PCM) to control the operation of the battery pack to electrode terminals of the battery cells located at the upper end of the battery cell array by resistance welding, and (c) disposing the battery cell array and the protection circuit module on a lower case and covering the lower case with an upper case to fix the battery cell array and the protection circuit module in place.

In the battery pack manufacturing method according to the present invention, therefore, it is possible to more easily manufacture a battery pack having a compact structure than in a conventional battery pack manufacturing method.

In a preferred example, step (a) may further include placing each of the battery cells in a mold and coating the outer sides of the battery cells with a resin by insert injection molding excluding the electrode terminals of the battery cells. Alternatively, step (a) may further include placing the battery cell array in a mold and coating the outer side of the battery cell array with a resin by insert injection molding excluding the electrode terminals of the battery cells. Consequently, it is possible to improve mechanical strength of the battery cells and to prevent the battery cells from moving in the pack case.

In another preferred example, step (b) may further include placing the battery cell array, to which the PCM is connected by resistance welding, in a mold and coating the battery cell array and the PCM with a resin by insert injection molding. In this case, the battery cell assembly may be used as a finished battery pack without using an additional upper case and lower case. Consequently, step (c) may be omitted.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Now, exemplary embodiments of the present invention will be described in detail with reference to the accompanying drawings. It should be noted, however, that the scope of the present invention is not limited by the illustrated embodiments.

Figure 1:
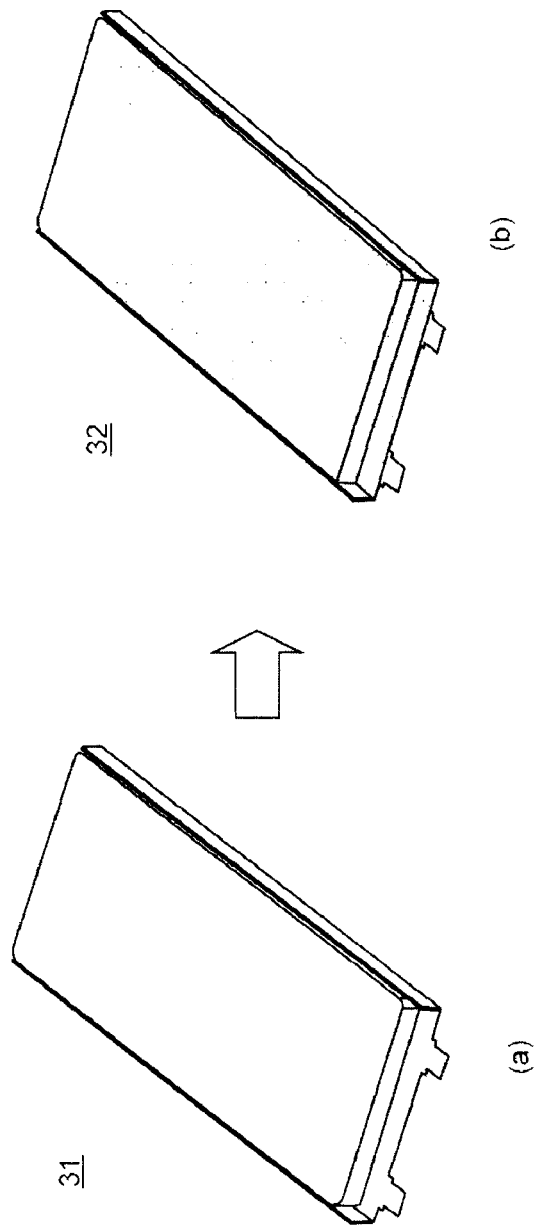
FIGS. 1 to 3 are perspective views showing a process of manufacturing a battery pack according to an embodiment of the present invention.
Figure 2:
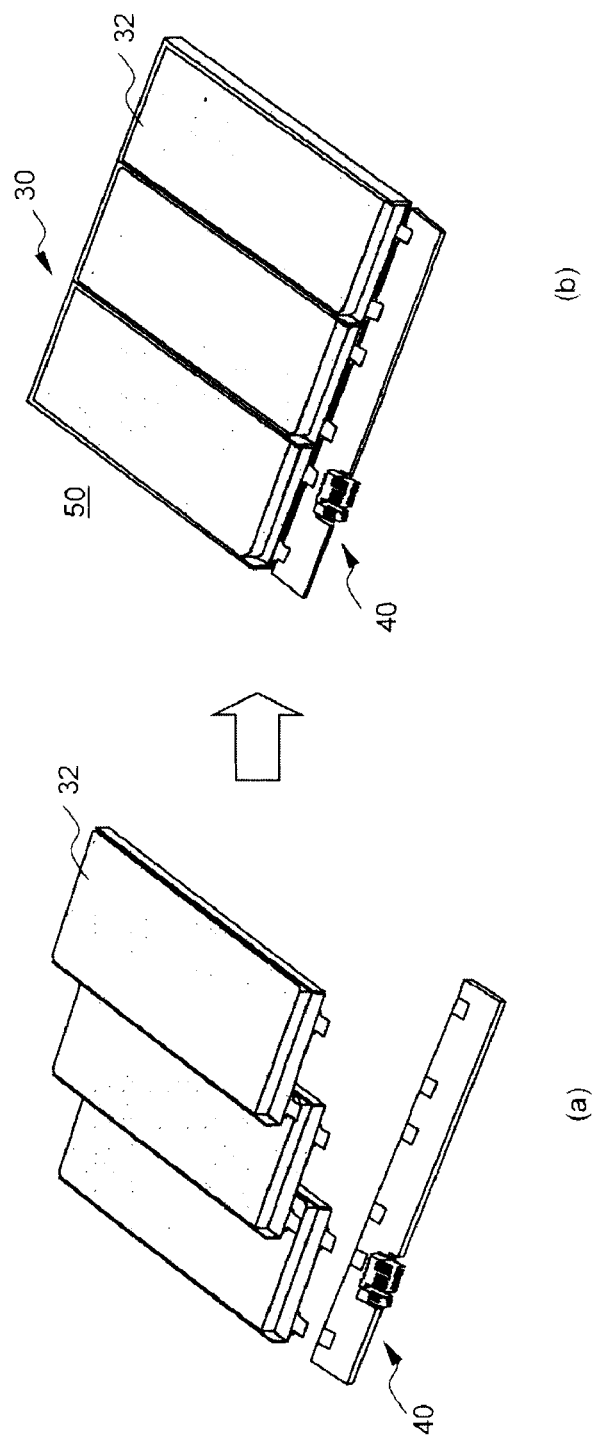
Figure 3:
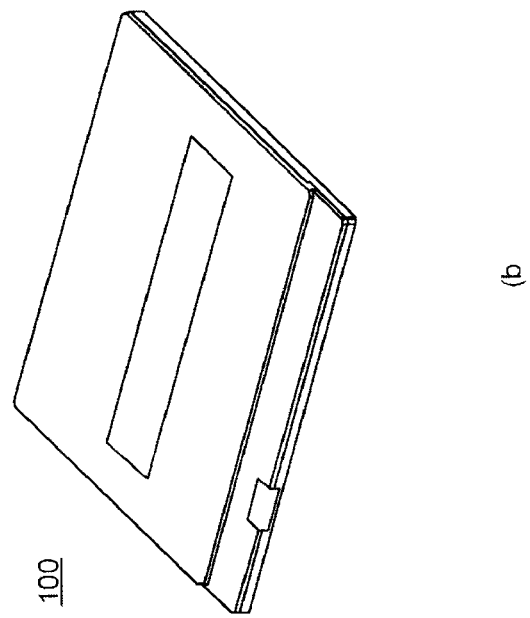
Figure 3:
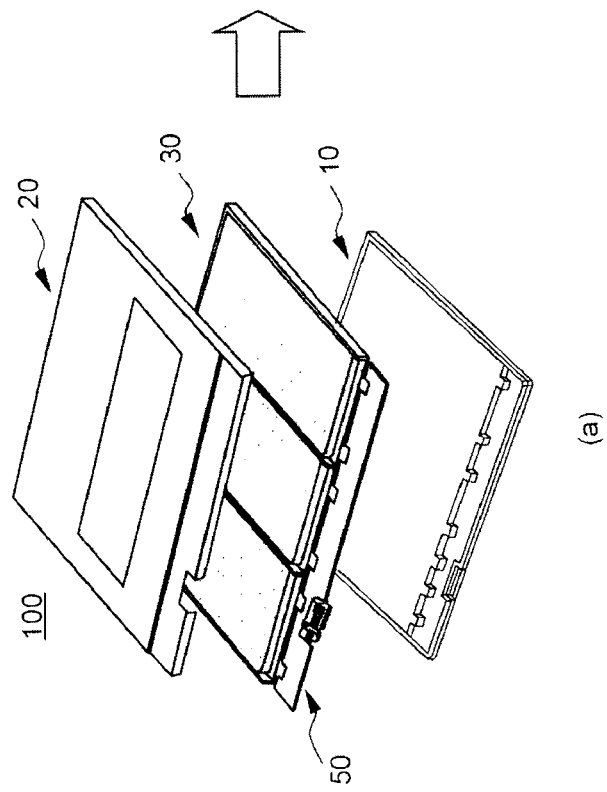

FIGS. 1 to 3 are perspective views typically showing a process of manufacturing a battery pack according to an embodiment of the present invention.

Referring to these drawings, the battery pack is manufactured as follows. First, a battery cell 31 as shown in FIG. 1(a) is placed in a mold, and the outer side or the battery cell 31 is coated with rubber by insert injection molding excluding electrode terminals of the battery cell 31 to manufacture a battery cell 32 as shown in FIG. 1(b).

Subsequently, three battery cells 32, one of which is shown in FIG. 1(b), are welded to a protection circuit in series and/or in parallel as shown in FIG. 2(a) to manufacture a battery cell assembly 50 as shown in FIG. 2(b).

Subsequently, the battery cell assembly 50 of FIG. 2(b) is disposed on a lower case 10 as shown in FIG. 3(a), and an upper case 20 covers the lower case 10 so as to fix the battery cell assembly 50 in place. In this way, a battery pack 100 as shown in FIG. 3(b) is completed.

Specifically, referring to FIG. 2(b), the battery cell assembly 50 includes a battery cell array 30 including the three battery cells 32, the outer side of each of which is coated with a resin by insert injection molding excluding the electrode terminals of each of the battery cells 32, arranged in the lateral direction and a protection circuit module 40 connected to the upper end of the battery cell array 30.

Each of the battery cells 32 is a pouch-shaped secondary battery configured so that an electrode assembly having a cathode/separator/anode structure is disposed in a battery case together with an electrolyte in a sealed state. The pouch-shaped secondary battery is generally configured to have a plate-shaped structure, i.e. an approximately hexahedral structure having a small thickness to width ratio. Generally, the pouch-shaped secondary battery includes a pouch-shaped battery case. The battery case is configured to have a laminate sheet structure in which an outer coating layer formed of a polymer resin exhibiting high durability, a barrier layer formed of a metal material blocking moisture or air, and an inner sealant layer formed of a polymer resin that can be thermally welded are sequentially stacked.

Referring to FIG. 3(a), a pack case includes a lower case 10 to which the battery cell array 30 and the protection circuit module 40 are mounted and an upper case 20 disposed above the lower case 10 to fix the battery cell array 30 and the protection circuit module 40 in place.

Figure 4:
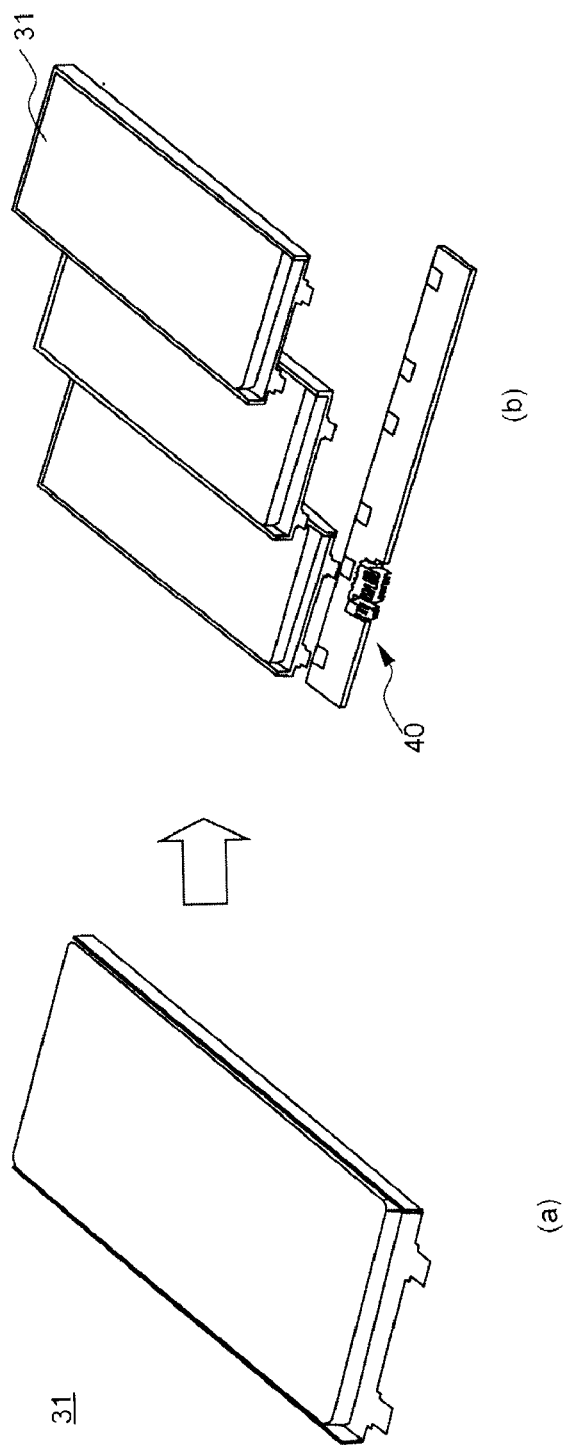
FIGS. 4 to 6 are perspective views showing a process of manufacturing a battery pack according to another embodiment of the present invention.
Figure 5:
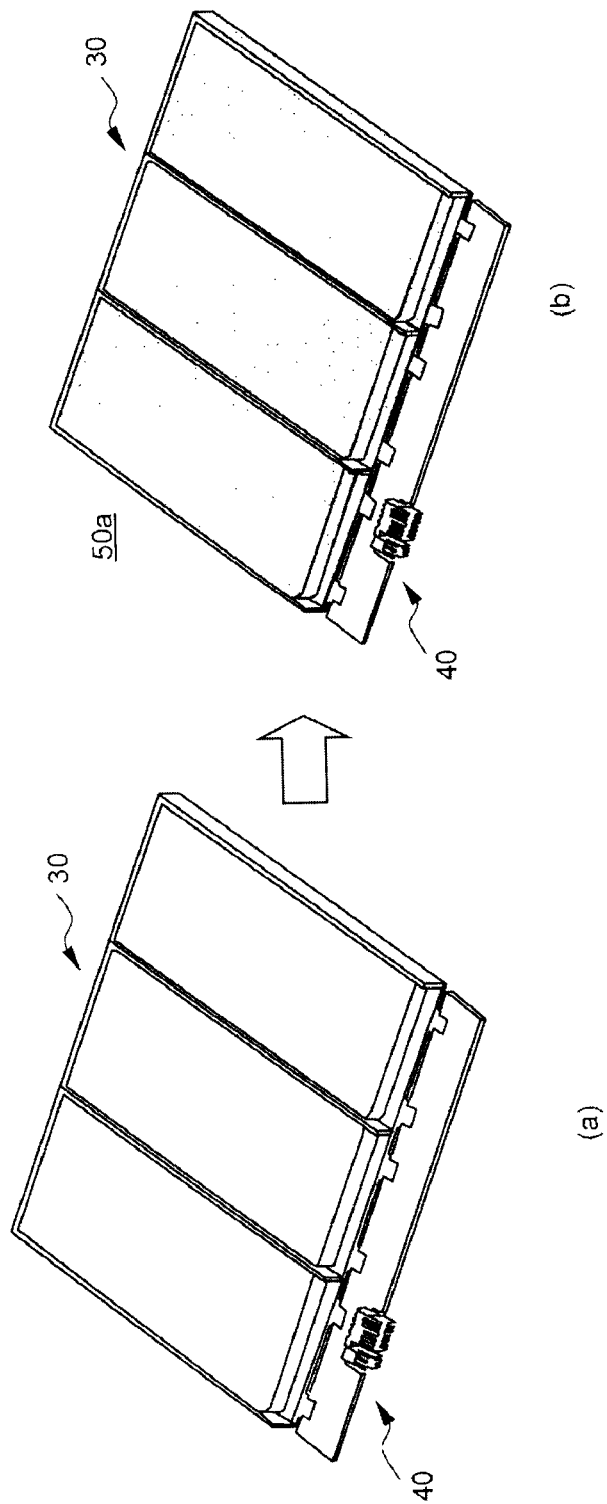
Figure 6:
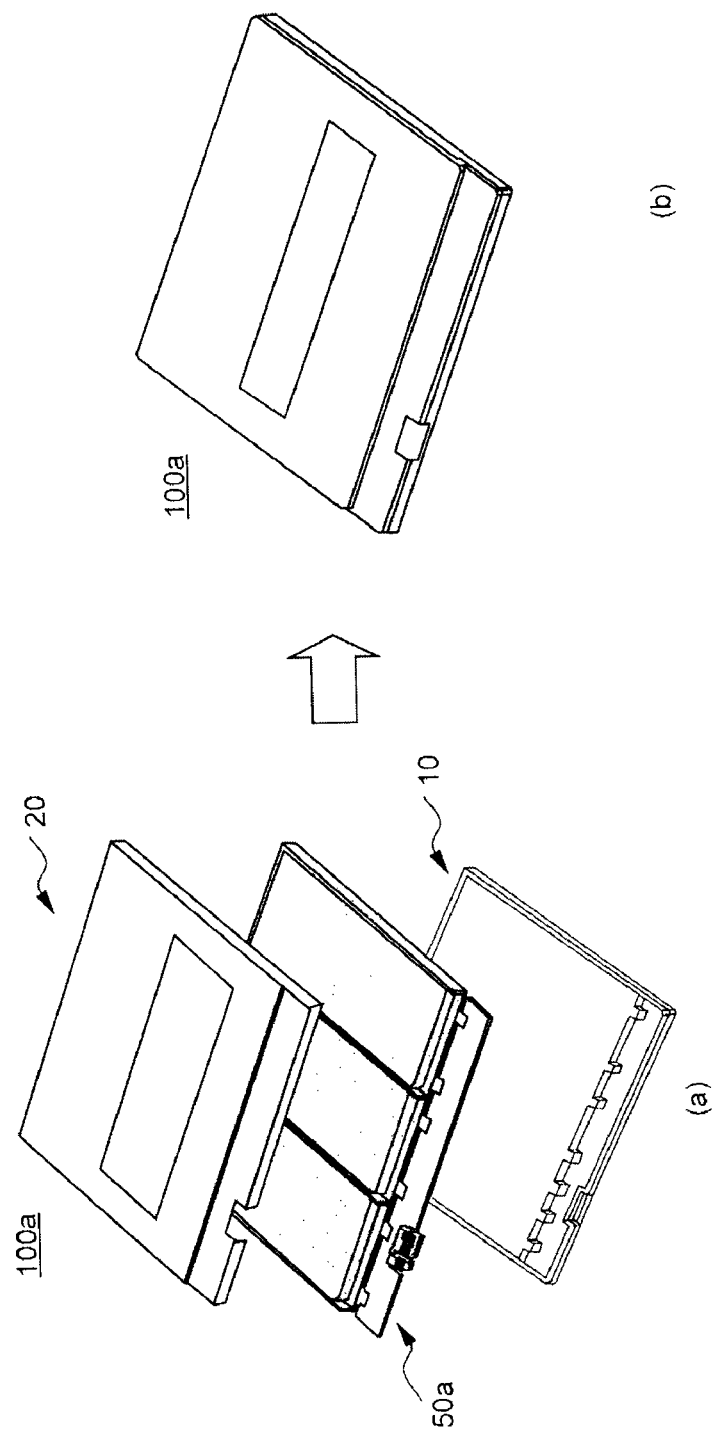

FIGS. 4 to 6 are perspective views typically showing a process of manufacturing a battery pack according to another embodiment of the present invention.

Referring to these drawings, the battery pack is manufactured as follows. First, three battery cells 31, one of which is shown in FIG. 4(a), are welded to a protection circuit 40 in series and/or in parallel in a state in which the battery cells 31 are arranged in the lateral direction as shown in FIG. 4(b).

Subsequently, a battery cell array 30 is placed in a mold, and the outer side of the battery cell array is coated with rubber by insert injection molding excluding electrode terminals of the battery cells and a protection circuit module to manufacture a battery cell assembly 50a as shown in FIG. 5(b).

Subsequently, the battery cell assembly 50a of FIG. 5(b) is disposed on a lower case 10 as shown in FIG. 6(a), and an upper case 20 covers the lower case 10 so as to fix the battery cell assembly 50a in place. In this way, a battery pack 100a as shown in FIG. 6(b) is completed.

Figure 7:
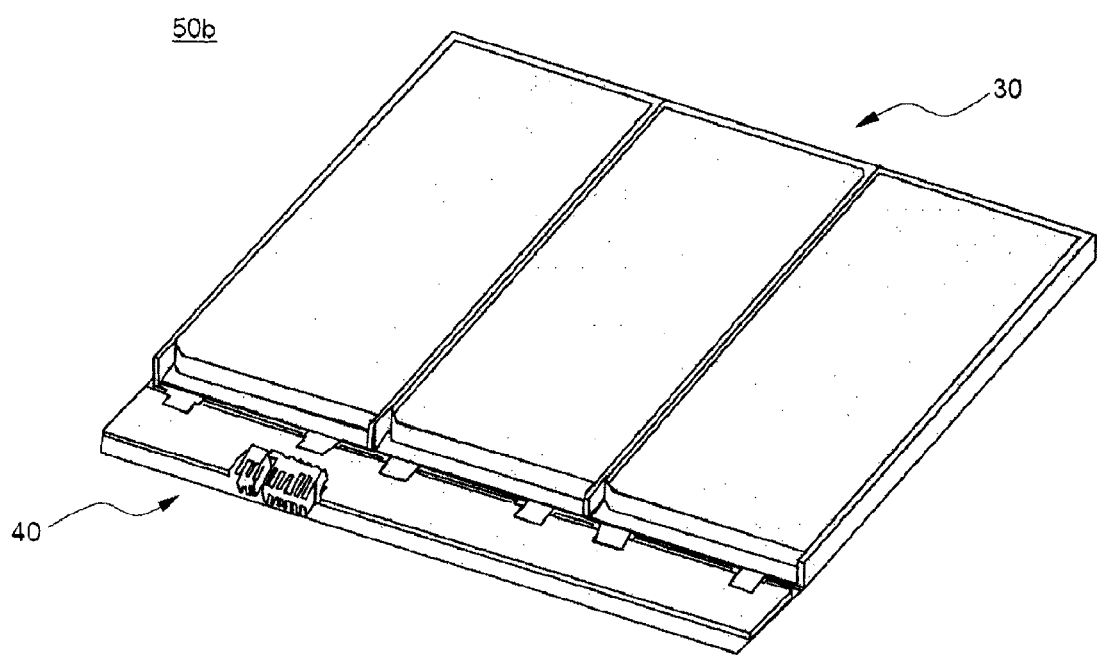
FIG. 7 is a perspective view showing a battery cell assembly according to another embodiment of the present invention.

FIG. 7 is a perspective view typically showing a battery cell assembly according to another embodiment of the present invention.

Referring to FIG. 7, a battery cell assembly 50b is configured so that the outer side of a battery cell array 30 and the outer side of a protection circuit module 40 are completely coated with rubber by insert injection molding. This battery cell assembly 50b may be used as a finished battery pack without being mounted in an additional pack case.

Figure 8:
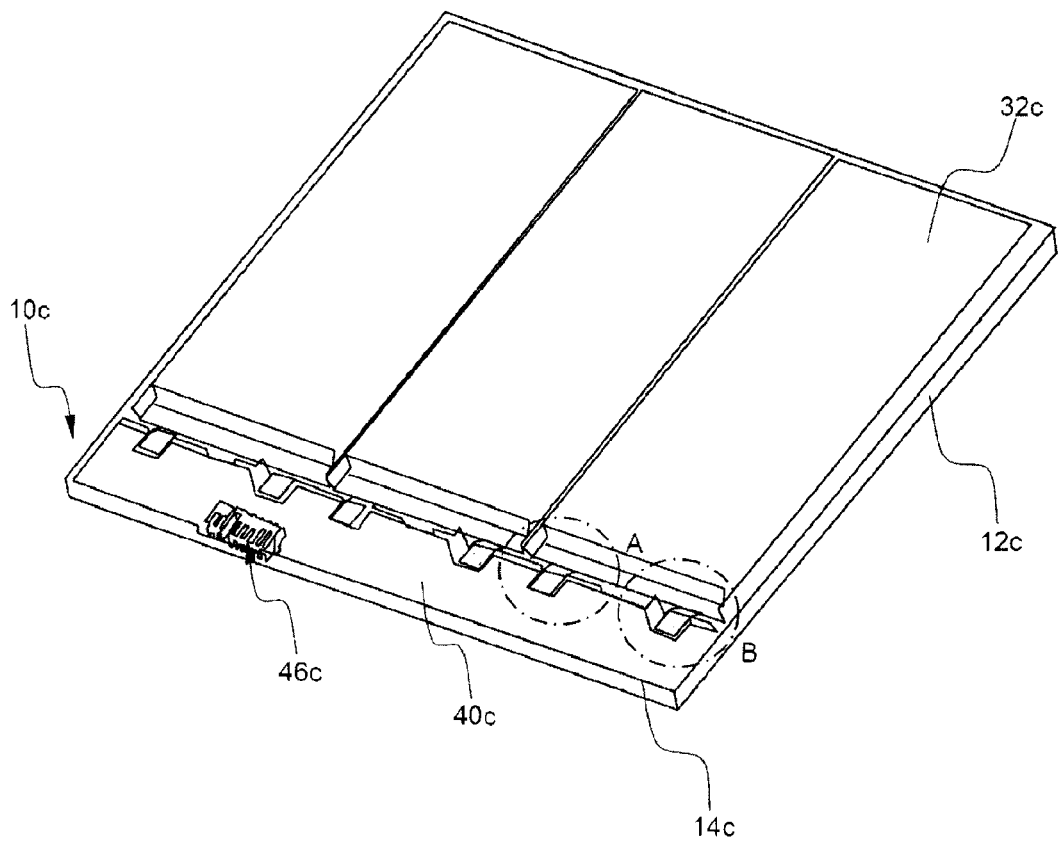
FIG. 8 is a perspective view showing a battery cell array according to another embodiment of the present invention.
Figure 9:
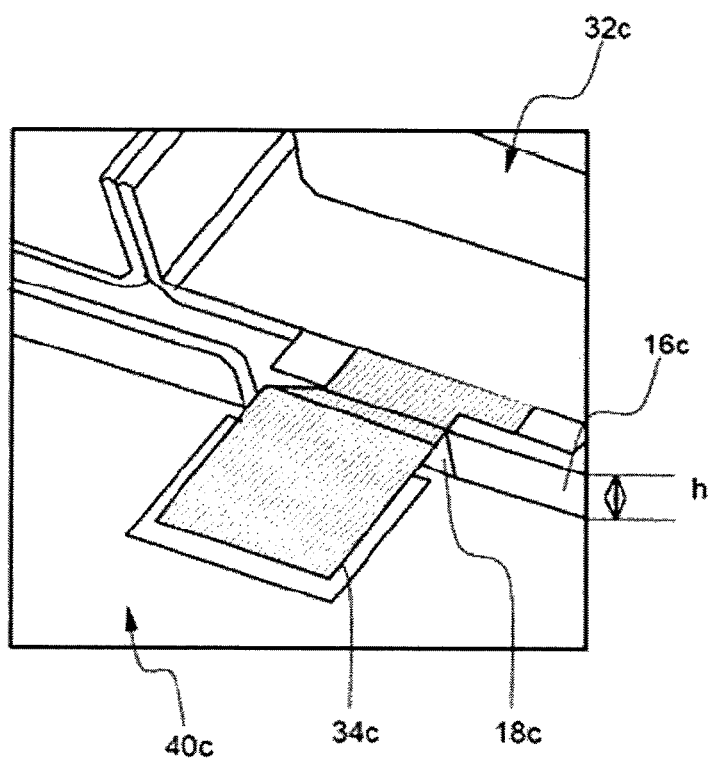
FIG. 9 is an enlarged view typically showing a region A of FIG. 8.
Figure 10:
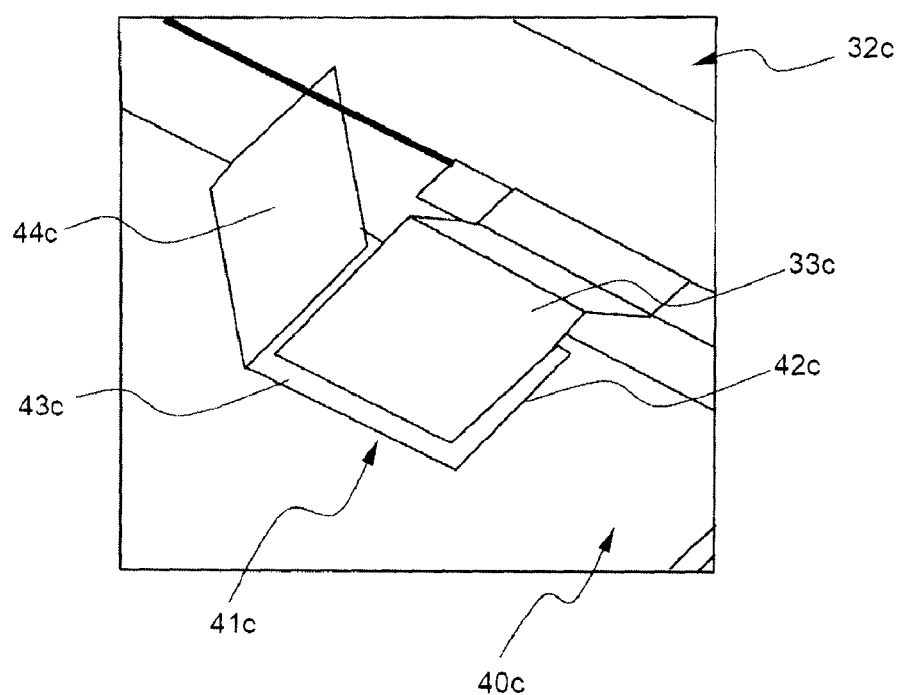
FIG. 10 is an enlarged view typically showing a region B of FIG. 8.

FIG. 8 is a perspective view typically showing a battery cell array according to another embodiment of the present invention. FIG. 9 is an enlarged view typically showing a region A of FIG. 8, and FIG. 10 is an enlarged view typically showing a region B of FIG. 8.

Referring to these drawings, a lower case 10c is partitioned into a battery cell mounting part 12c, at which battery cells 32c are disposed, and a protection circuit module mounting part 14c, at which a protection circuit module 40c is disposed.

A partition wall 16c is formed at the interface between the battery cell mounting part 12c and the protection circuit module mounting part 14c. Openings 18c, through which anode terminals 34c of the battery cells 32c are exposed toward the protection circuit module 40c, are formed at portions of the partition wall 16 corresponding to electrical connection regions between the anode terminals 34c of the battery cells 32c and the protection circuit module 40c.

The partition wall 16c has a height h sufficient to fully isolate the battery cell mounting part 12c and the protection circuit module 40c from each other. According to circumstances, a corresponding partition wall may be formed at the upper case (not shown) so as to achieve the above-mentioned isolation.

The protection circuit module 40c includes connection terminals 42c connected to cathode terminals 33c of the battery cells 32c by resistance welding, metal plates (not shown) to electrically connect the connection terminals 42c to each other, and a protection circuit (not shown) to control the operation of the battery pack.

An electrical connection region B between the cathode terminal 33c of each of the battery cells 32c and the protection circuit module 40c is configured to have a structure in which a conductive plate 41c attached to a corresponding one of the connection terminals 42c of the protection circuit module 40c wraps the cathode terminal 33c of each of the battery cells 32c.

Also, the conductive plate 41c, which may be a nickel plate, includes a first connection part 43c attached to the top of the corresponding connection terminal 42c of the protection circuit module 40c and a second connection part 44c attached to the top of the cathode terminal, which may be an aluminum terminal, of the corresponding battery cell 32.

Specifically, the conductive plate 41c is attached to the top of the corresponding connection terminal 42c of the protection circuit module 40c in an L shape. The conductive plate 41 is bent in a bracket shape in a state in which the cathode terminal 33c of the corresponding battery cell 32c is placed at the top of the first connection part 43c of the conductive plate 41c, and then resistance welding is carried out from above the second connection part 44c, which is a bent portion of the conductive plate 41c.

Meanwhile, an external input and output terminal, i.e. a connector 46c, which inputs electric current to the battery pack, outputs electric current from the battery pack, and transmits and receives information, is mounted at the front of the protection circuit module 40c in a depressed form.

Figure 11:
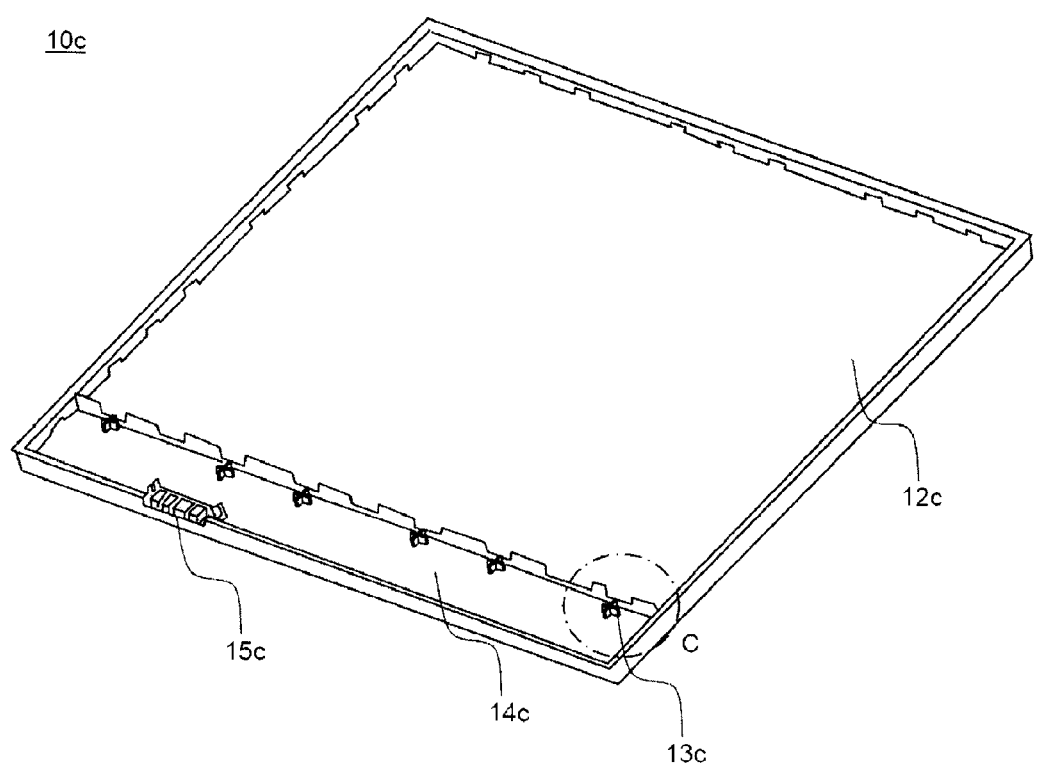
FIG. 11 is a perspective view of a lower case.
Figure 12:
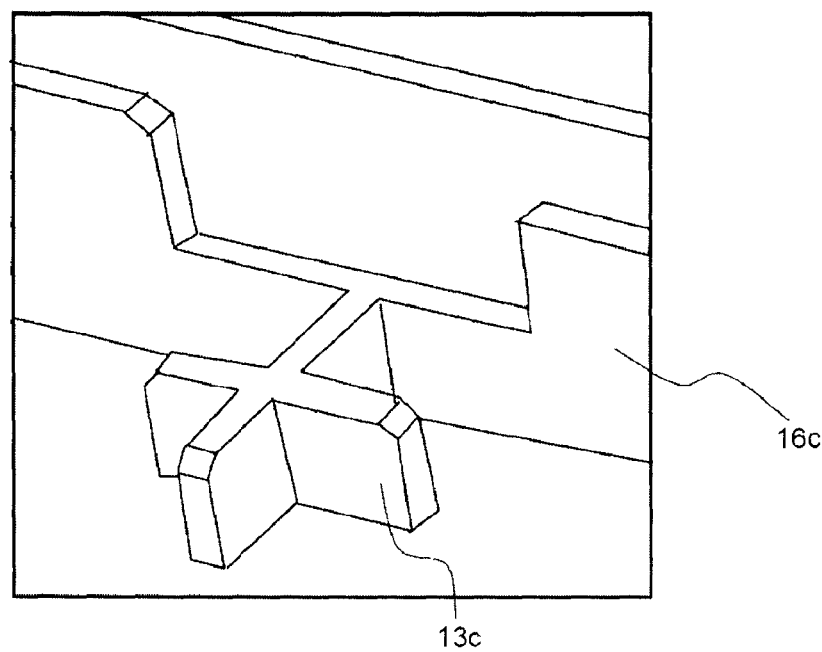
FIG. 12 is an enlarged view typically showing a region C of FIG. 11.

FIG. 11 is a perspective view typically showing the lower case, and FIG. 12 is an enlarged view typically showing a region C of FIG. 11.

Referring to these drawings together with FIGS. 8 and 10, an external input and output terminal mounting part 15c, in which an external input and output terminal 46c, which inputs electric current to the battery pack, outputs electric current from the battery pack, and transmits and receives information, is mounted, is formed at the protection circuit module mounting part 14c of the lower case 10c.

Also, a support part 13c to support the electrical connection region between the cathode terminal 33c of each of the battery cells 32c and the protection circuit module 40c is formed on the lower case 10c in the shape of an upward cross-shaped protrusion in a state in which the support part 13 is connected to the partition wall 16c. The support part 13 appropriately supports downward pressure applied by a welding tip (not shown) to be located above the cathode terminal 33c of each of the battery cells 32 during resistance welding, thereby providing high welding force.

Figure 13:
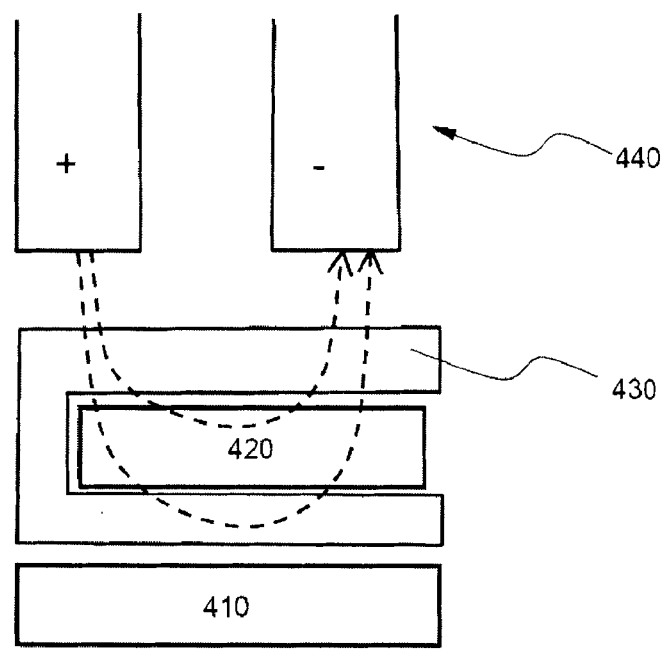
FIG. 13 is a typical view showing a resistance welding structure of the present invention.

FIG. 13 is a typical view showing a resistance welding structure of the present invention.

Referring to FIG. 13, electric current generated from a resistance welding rod 440 during resistance welding between a nickel plate 430, located at the top of a protection circuit board 410, and an aluminum terminal 420 flows from the nickel plate 430, resistance of which is high, to the aluminum terminal 420, resistance of which is low, and flows back to the nickel plate 430. At this time, heat is generated at the interface between the aluminum terminal 420 and the nickel plate 430 due to resistance difference therebetween with the result that the resistance welding between the nickel plate 430 and the aluminum terminal 420 is easily achieved.

Figure 14:
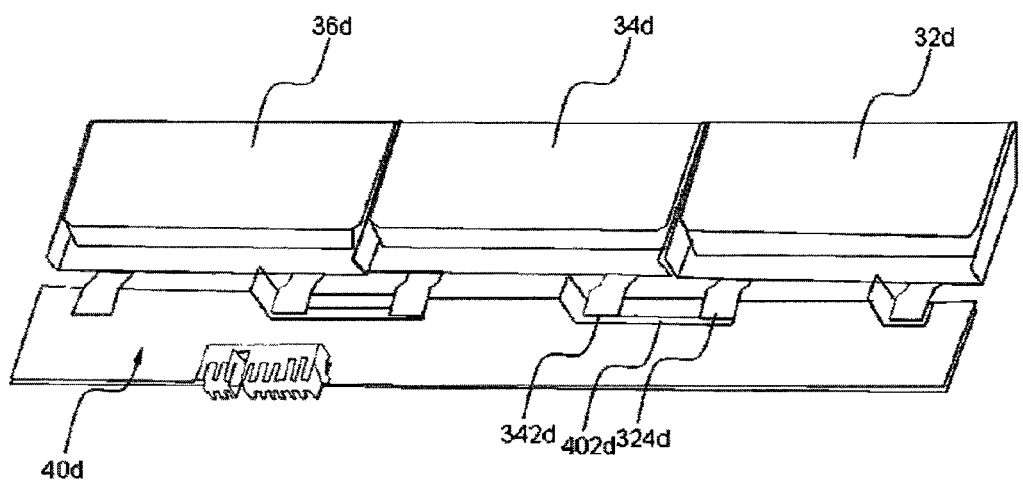
FIG. 14 is a partial perspective view showing a structure in which a plurality of pouch-shaped battery cells according to another embodiment of the present invention is electrically connected to each other.
Figure 15:
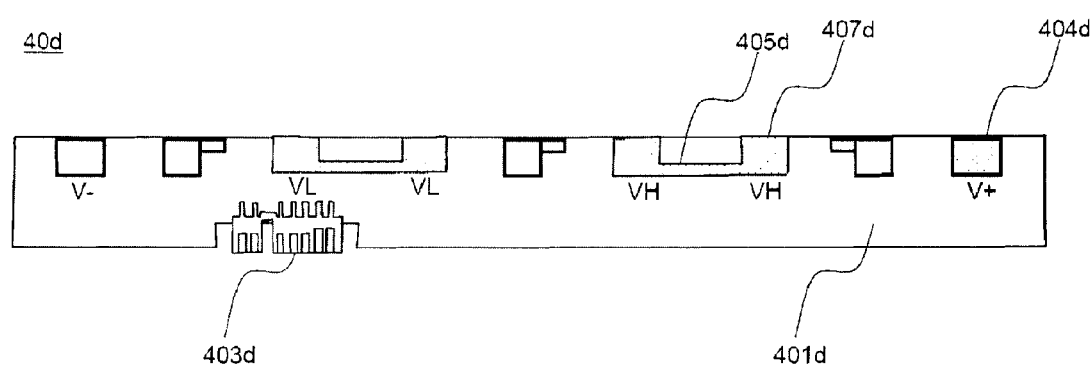
FIG. 15 is an enlarged plan view typically showing a protection circuit module (PCM) of FIG. 14.

FIG. 14 is a partial perspective view typically showing a structure in which a plurality of pouch-shaped battery cells according to another embodiment of the present invention is electrically connected to each other, and FIG. 15 is an enlarged plan view typically showing a protection circuit module (PCM) of FIG. 14.

Referring to these drawings, metal plates 402d to electrically connect battery cells 32d, 34d and 36d to each other are formed at the top of a protection circuit module 40d in a structure in which an anode terminal 324d of the first battery cell 32d is connected in series to a cathode terminal 342d of the second battery cell 34d.

Also, the protection circuit module 40d includes a PCM main body 401d having a protection circuit to control overcharge, overdischarge and overcurrent, connection terminals 404d and 407d formed at positions of the PCM main body 401d corresponding to the electrode terminals of the battery cells 32d, 34d and 36d so as to directly electrically connect the battery cells 32d, 34d and 36d to each other, metal plates 405d formed at the top of the PCM main body 401d to electrically connect the connection terminals 404d and 407d to each other, and an external input and output terminal 403d to input electric current to the battery pack, to output electric current from the battery pack, and to transmit and receive information, are mounted at the front of the PCM main body 401 in a depressed form.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, the battery cell assembly according to the present invention is configured so that the outer sides of the respective battery cells or the outer side of the battery cell array is coated with a resin by insert injection molding excluding the electrode terminals of the battery cells. Consequently, it is possible to simplify an assembly process and to effectively prevent the battery cells or the battery cell array from moving in the pack case.

Also, the battery cells or the battery cell array is coated with the resin. Consequently, it is possible to greatly improve mechanical strength of the battery cell assembly.

The invention claimed is:

1. A battery pack comprising:
a battery assembly comprising a battery cell array comprising two or more battery cells, each of which has an electrode assembly of a cathode/separator/anode structure disposed in a battery case together with an electrolyte in a sealed state, arranged in a lateral direction and electrode terminals extending from each battery cell;
a protection circuit module (PCM) connected to an upper end of the battery cell array;
a pack case in which the battery cell assembly is disposed, the pack case comprising:
a lower case at which the battery cell array and the PCM are disposed; and
an upper case to cover the lower case so as to fix the battery cell array and the PCM in place;
a partition wall extending upwardly from the lower case in which the partition wall is a separate element from the PCM; and
wherein the lower case is partitioned into a battery cell mounting part, at which the battery cells are disposed, and a PCM mounting part, at which the PCM is disposed,
wherein the partition wall is formed at an interface between the battery cell mounting part and the PCM mounting part,
wherein openings are formed in the partition wall at locations corresponding to electrical connection regions between the electrode terminals of the battery cells and the PCM through which electrode terminals of the battery cells are allowed to pass toward the PCM, the openings having a bottom edge,
wherein the electrode terminals are directly connected to the PCM,
wherein outer sides of the battery cells or an outer side of the battery cell array is coated with a resin excluding the electrode terminals of the battery cells,
wherein the PCM mounting part comprises a support part at each opening in the partition wall to support the electrical connection regions between the electrode terminals of the battery cells and the PCM, and
wherein a top surface of each support part has a height equal to a height of the bottom edge of a corresponding opening.

2. The battery pack according to claim 1, wherein the resin is rubber or plastic.

3. The battery pack according to claim 1, wherein an outer side of the battery cell array and an outer side of the PCM are completely coated with rubber or plastic.

4. The battery pack according to claim 1, wherein the PCM comprises connection terminals connected to the electrode terminals of the battery cells by resistance welding, metal plates to electrically connect the battery cells to each other, and a protection circuit to control the operation of the battery pack.

5. The battery pack according to claim 4, wherein the metal plates to electrically connect the battery cells to each other are formed at a top of the PCM.

6. The battery pack according to claim 4, wherein electrical connection regions between cathode terminals of the battery cells and the PCM are configured to have a structure in which conductive plates attached to tops of the respective connection terminals of the PCM are welded so that the conductive plates wrap the respective cathode terminals of the battery cells.

7. The battery pack according to claim 6, wherein each of the conductive plates comprises a first connection part attached to the top of a corresponding one of the connection terminals of the PCM and a second connection part attached to a top of the cathode terminal of a corresponding one of the battery cells.

8. The battery pack according to claim 7, wherein each of the conductive plates is a nickel plate, and each of the cathode terminals of the battery cells is an aluminum terminal.

9. The battery pack according to claim 1, wherein each of the battery cells is a pouch-shaped secondary battery.

10. The battery pack according to claim 1, wherein an external input and output terminal, which inputs electric current to the battery assembly, outputs electric current from the battery assembly, and transmits and receives information, are mounted at a front of the PCM in a depressed form.

11. A laptop computer comprising the battery pack according to claim 1 as a power source.

12. A method of manufacturing a battery pack according to claim 1, comprising:
   (a) arranging two or more battery cells, each of which has an electrode assembly of a cathode/separator/anode structure disposed in a battery case together with an electrolyte in a sealed state, in a lateral direction to form a battery cell array;
   (b) coupling connection terminals of a PCM to control an operation of the battery pack to electrode terminals of the battery cells located at an upper end of the battery cell array by resistance welding;
   (c) disposing the battery cell array and the PCM on a lower case and covering the lower case with an upper case to fix the battery cell array and the PCM in place;
   (d) forming a partition wall extending upwardly from the lower case, the partition wall having openings; and
   (e) extending the electrode terminals through the openings.

13. The method according to claim 12, wherein step (a) further comprises placing each of the battery cells in a mold and coating outer sides of the battery cells with a resin by insert injection molding excluding the electrode terminals of the battery cells.

14. The method according to claim 12, wherein step (a) further comprises placing the battery cell array in a mold and coating an outer side of the battery cell array with a resin by insert injection molding excluding the electrode terminals of the battery cells.

15. The method according to claim 12, wherein step (b) further comprises placing the battery cell array, to which the PCM is connected by resistance welding, in a mold and coating the battery cell array and the PCM with a resin by insert injection molding.

16. The battery pack according to claim 1, wherein the openings are notches extending downwardly from a top edge of the partition wall.

17. The battery pack according to claim 16, further comprising a support extending from the PCM next to the notch.

18. The battery pack according to claim 1, wherein the support parts include a first section extending perpendicular to the partition wall and a second section extending parallel to the partition wall.

* * * * *